(12) United States Patent
Guo et al.

(10) Patent No.: US 9,711,894 B2
(45) Date of Patent: Jul. 18, 2017

(54) ELECTRICAL CONNECTOR AND PROGRAMMING METHOD

(71) Applicant: FOXCONN INTERCONNECT TECHNOLOGY LIMITED, Grand Cayman (KY)

(72) Inventors: Ru-Yang Guo, Kunshan (CN); Hai-Li Wang, Kunshan (CN); Shuai-Hui Huang, Kunshan (CN); Jian-Fang Li, Kunshan (CN); Qing-Man Zhu, Kunshan (CN); Jerry Wu, Irvine, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/161,291

(22) Filed: May 23, 2016

(65) Prior Publication Data

US 2016/0344143 A1 Nov. 24, 2016

(30) Foreign Application Priority Data

May 22, 2015 (CN) .......................... 2015 1 0262823

(51) Int. Cl.
*H01R 13/66* (2006.01)
*H01R 13/627* (2006.01)
*H05K 1/02* (2006.01)
*H01R 29/00* (2006.01)

(52) U.S. Cl.
CPC ....... *H01R 13/6275* (2013.01); *H05K 1/0292* (2013.01); *H01R 13/6658* (2013.01); *H01R 29/00* (2013.01); *H05K 2201/0909* (2013.01); *H05K 2201/09127* (2013.01)

(58) Field of Classification Search
CPC ..................... H01R 13/6275; H01R 13/6335
USPC ........................................ 439/350, 345, 271
See application file for complete search history.

(56) References Cited

U.S. PATENT DOCUMENTS

| 7,702,480 | B2 | 4/2010 | Beecher | |
|---|---|---|---|---|
| 8,187,019 | B2 | 5/2012 | Reed et al. | |
| 2011/0008976 | A1* | 1/2011 | Pipho | H01R 13/64 439/55 |
| 2011/0300735 | A1* | 12/2011 | Wu | H01R 13/6275 439/345 |
| 2012/0058665 | A1* | 3/2012 | Zerebilov | H01R 13/6335 439/370 |
| 2012/0214350 | A1* | 8/2012 | Wu | H01R 13/5812 439/676 |
| 2012/0220152 | A1* | 8/2012 | Wu | H01R 13/6335 439/350 |

* cited by examiner

*Primary Examiner* — Abdullah Riyami
*Assistant Examiner* — Nader Alhawamdeh
(74) *Attorney, Agent, or Firm* — Wei Te Chung; Ming Chieh Chang

(57) ABSTRACT

An electrical connector comprises a printed circuit board module including a printed circuit board (PCB) and a plurality of electrical elements disposed on the PCB, the PCB includes a mating end for mating with a mating connector and a plurality of conductive paths electrically connecting with the electrical elements; wherein the PCB includes a fracture surface, and the plurality of conductive paths are exposed to the fracture surface.

8 Claims, 4 Drawing Sheets

ELECTRICAL CONNECTOR AND PROGRAMMING METHOD

BACKGROUND OF THE INVENTION

1. Field of the Invention

The present invention relates to an electrical connector and a downloading method thereof, and more particularly to an electrical cable connector with a printed circuit board and a download method thereof.

2. Description of the Related Art

U.S. Pat. No. 8,187,019, issued on May 29, 2012, discloses a connector assembly including an outer shell, a printed circuit board module received in the outer shell, and a cable connecting with the printed circuit board module. A micro-processing chip is usually provided on a circuit board included in the module.

U.S. Pat. No. 7,702,480, issued on May 18, 2006, discloses a manufacturing test and programming system including providing a PCB tester, providing an in-system programmer electrically attached to the PCB tester, mounting a device under test having a programmable device attached thereon and programming the programmable device with the in-system pro-grammer.

Micro-processing chip of a connector according to existing technology is programmed via a dedicated programming interface, such as port terminals, but due to pins defined on an end of the connector are occupied, the micro-processing chip is downloaded via additional ports defined on another end of the printed circuit board. The length of the printed circuit board, therefore, is increased, the process of downloading program is more complex, and the hardware interface for downloading is not uniform.

Therefore, a cable connector assembly having an improved a download method is desired.

BRIEF SUMMARY OF THE INVENTION

An object of the present invention is to provide an electrical connector with a printed circuit board which facilitates programming.

In order to achieve above-mentioned object, An electrical connector comprising: a printed circuit board module including a printed circuit board (PCB) and a plurality of electrical elements disposed on the PCB, the PCB including a mating end for mating with a mating connector and a plurality of conductive paths electrically connecting with the electrical elements; wherein the PCB includes a fracture surface, and the plurality of conductive paths are exposed to the fracture surface.

Other objects, advantages and novel features of the invention will become more apparent from the following detailed description of the present embodiment when taken in conjunction with the accompanying drawings.

DESCRIPTION OF PREFERRED EMBODIMENT OF THE INVENTION

Figure 1:
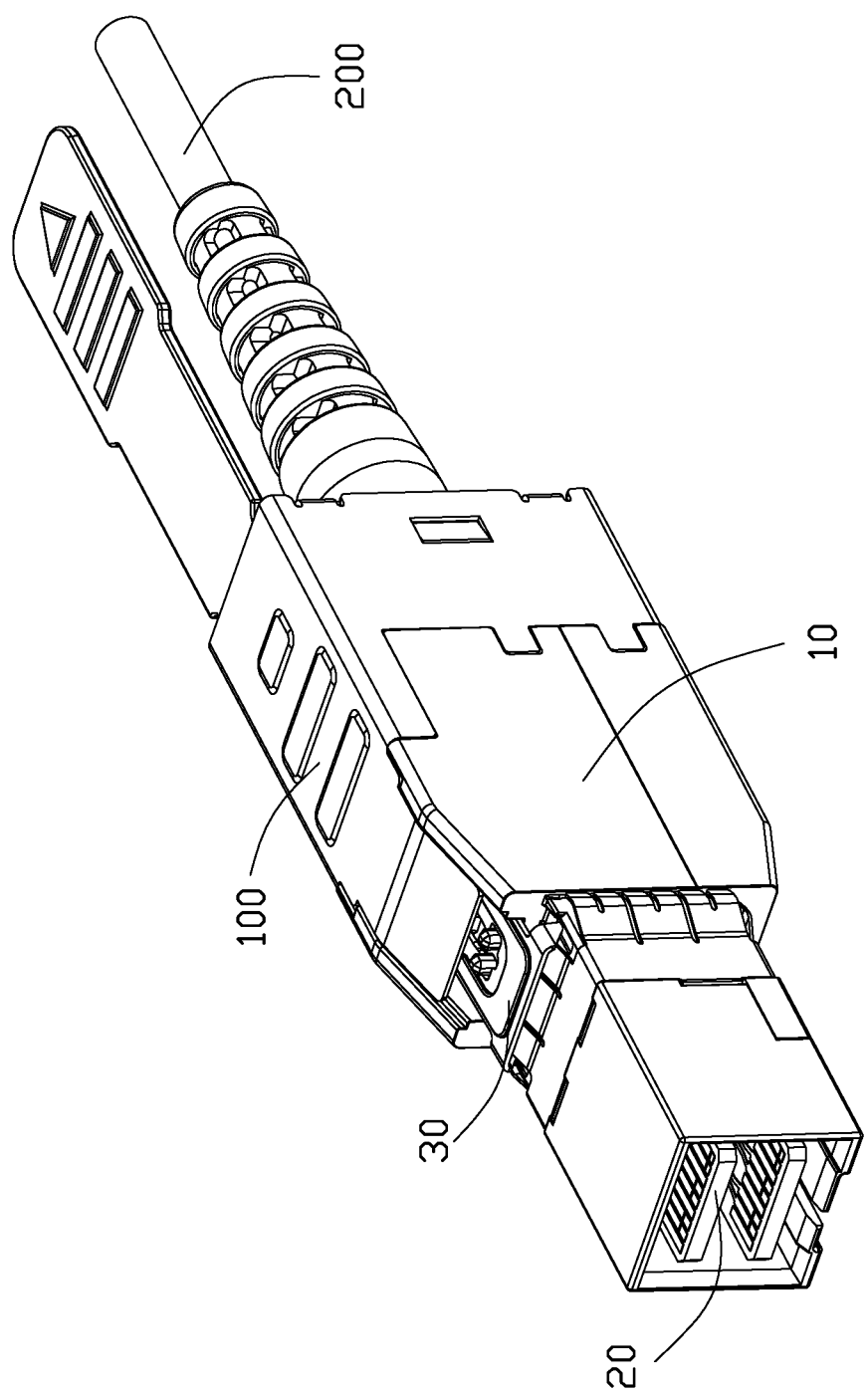
FIG. 1 is a perspective view showing an electrical connector in accordance with the present invention.
Figure 2:
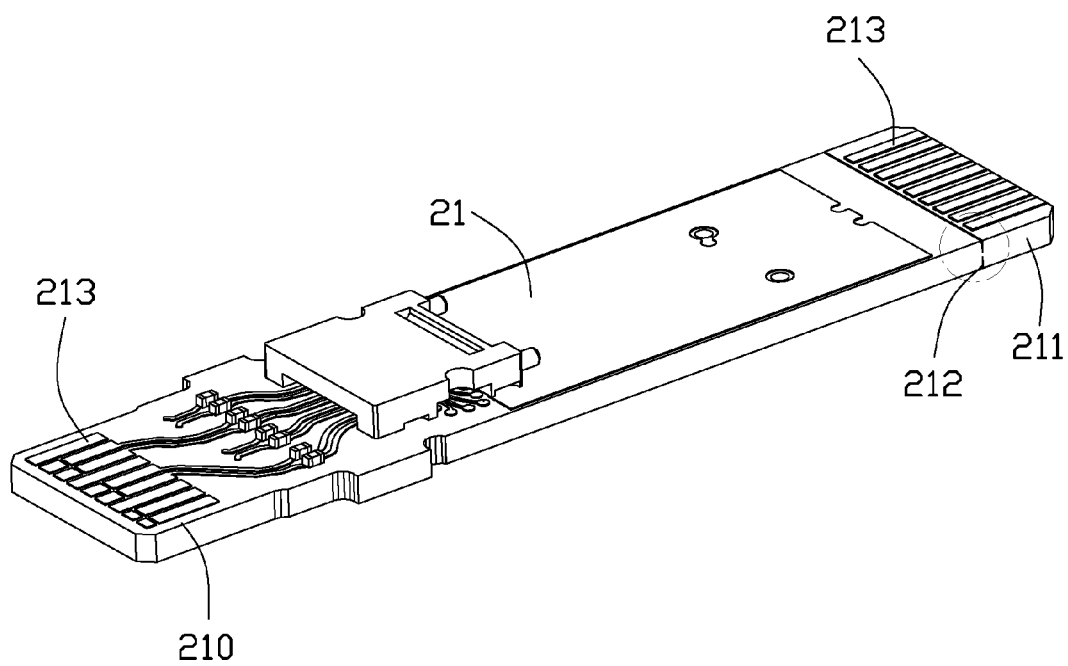
FIG. 2 is a perspective view showing a printed circuit board module of the electrical connector shown in FIG. 1.
Figure 3:
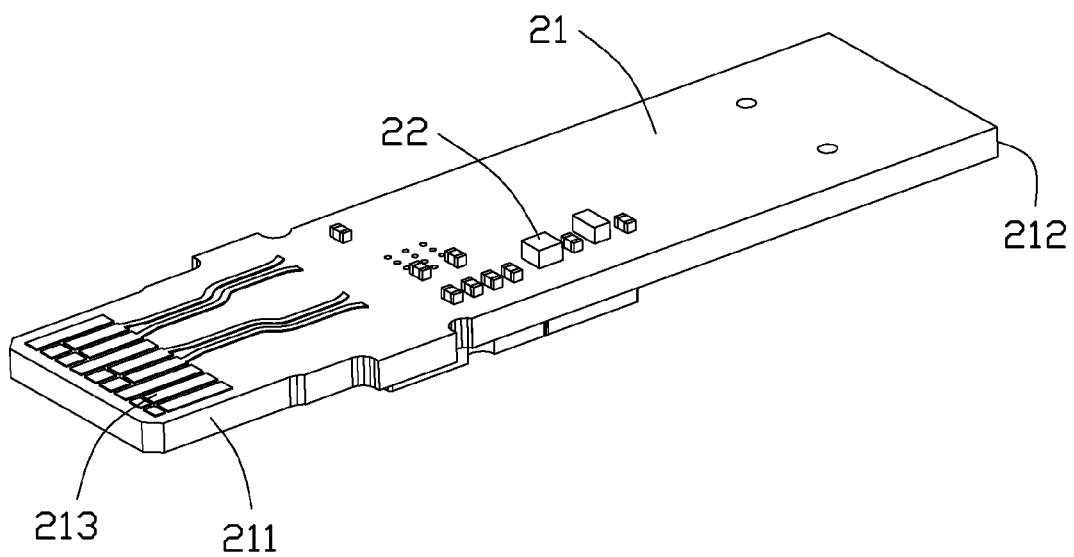
FIG. 3 is a perspective view showing the printed circuit board module shown in FIG. 2, after the processing input end is cut.
Figure 4:
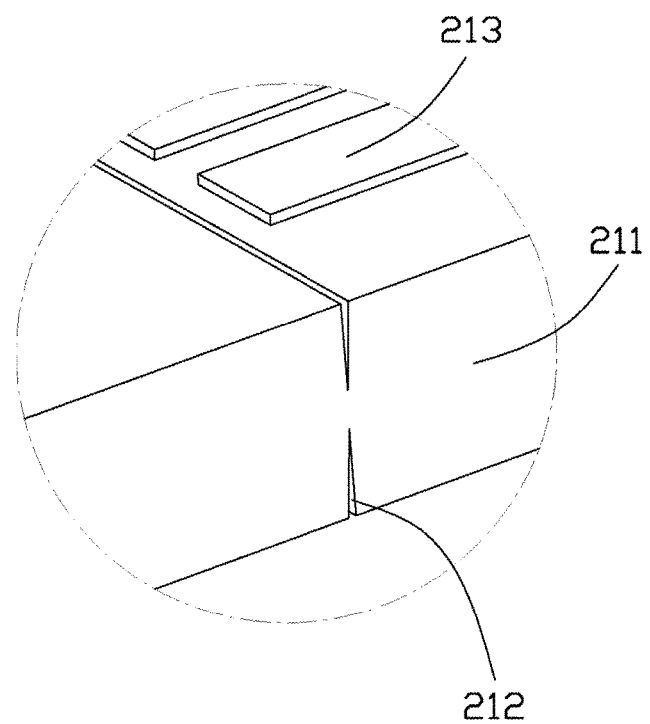
FIG. 4 is a enlarged view showing the circle structure shown in FIG. 1.

Reference will now be made to the drawing figures to describe a preferred embodiment of the present invention in detail. Referring to FIGS. 1-4, the electrical connector according to the present invention is connected with a cable 200. The cable 200 can be fiber optic cable or copper cable. The electrical connector 100 includes an outer case 10, a pair of printed circuit board module 20 received in the outer case 10 and latching module 30 assembled on the outer case 10 to mat with a mating connector. The outer case 10 in the present embodiment is made by die-casting metal material. The number of the printed circuit board module 20 can be set according to specific needs.

The printed circuit board module 20 includes a printed circuit board 21 and plurality of electrical elements 22 defined on the printed circuit board 21. The electrical elements 22 are micro-processing chips or other electronic components need to write program. The printed circuit board 21 includes a mating end 210 for mating with the mating connector and a program input end 211, a dent 212 defined on the program input end 211. The mating end 210 is opposite to the program input end 211. The mating end 210 defines a plurality of conductive pads 213 for connecting with the mating connector. The program input end 211 defines a plurality of conductive pads 213. The conductive pads 213 on the mating end 210 are arranged symmetrically with the conductive pads 213 on the program input end 211. The printed circuit board 21 defines a plurality of conductive paths (not shown) connecting with the electronic components and the conductive pads 213 on the program input end 211. The program input end 211 is cut after the program is downloaded, along the dent 212. The cross section of the dent 212 is of V-shaped. Both of the upper side and lower side of the program input end 211 define a dent 212, the dents 212 on the upper side and the lower side respectively are not communicated with each other. A fracture surface is formed on a corresponding position beside the dent 212 of the printed circuit board 21 after the program input end 211 is cut, so as to expose a plurality of cross sections (not shown) of the conductive paths upon the fracture surface. Notably, the fracture surface of the printed circuit board may be coated with some insulative material thereon for not exposing the cross-sections of the conductive paths.

The program download method of the electrical element 22 on the printed circuit board 21 of the electrical connector 100 includes the steps following:

Providing a printed circuit board module 20 as described above;

Connecting the program input end 211 with an external interface to complete the program downloads; and Cutting the program input end 211 along the dent 212.

The electrical connector 100 according to the present invention can complete the program downloads via the program input end 211 of the printed circuit board 21. The program input end 211 is cut after downloads are completed. The length of the printed circuit board 21 does not increase because of the program downloads, and the result is a simple, unified interface to download. In other words, the outer case is dimensioned with a length along the front-to-back direction which is larger than that of the printed circuit board after the program input end 211 is removed while smaller than that of the printed circuit board before the program input end 211 is removed. In other words, with the removal arrangement of the program input end, the whole connector assembly may not only keep the relatively miniature dimension along the front-to-back direction but also have a relatively light weight of the whole connector assembly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the board general meaning of the terms in which the appended claims are expressed.

What is claimed is:

1. An electrical connector comprising: a printed circuit board module including a printed circuit board (PCB) and a plurality of electrical elements disposed on the PCB, the PCB including a mating end for mating with a mating connector and a plurality of conductive paths electrically connecting with the electrical elements; and an outer case enclosing the PCB module: wherein the PCB includes a fracture surface, and the plurality of conductive paths are exposed to the fracture surface; the printed circuit board defining, along the front-to-back direction, a first dimension before a program input end is removed, and a second dimension after the program input end is removed; wherein a base dimension is configured to be long enough to comply with the second dimension of the printed circuit board, and to be relatively short not to comply with the first dimension of the printed circuit board.

2. The electrical connector as described in claim 1, wherein the plurality of electrical elements comprise a micro-processing chip.

3. A program downloading method for an electrical connector, comprising the steps of:
preparing a printed circuit board module to have a printed circuit board (PCB), a plurality of electrical elements on the PCB, a mating end for mating with a mating connector, a program input end, a plurality of conductive paths connecting the electrical elements to the program input end, and a dent at the program input end;
connecting the program input end to a plurality of external input interfaces for program downloading; and
cutting the program input end along the dent.

4. The program downloading method as described in claim 3, further including a step of applying insulative material upon a fracture surface of the printed circuit board around said dent after the program input end is removed.

5. An electrical connector assembly comprising:
an outer case defining a base dimension along a front-to-back direction;
a printed circuit board module including a printed circuit board (PCB) and a plurality of electrical elements disposed on the PCB, the PCB originally including, along the front-to-back direction, a mating end for mating with a mating connector and a program input end opposite to said mating end for downloading programs to the electrical elements while said program input end is removed once the programs have been downloaded;
the printed circuit board defining, along the front-to-back direction, a first dimension before the program input end is removed, and a second dimension after the program input end is removed; wherein
the base dimension is configured to be long enough to comply with the second dimension of the printed circuit board, and to be relatively short not to comply with the first dimension of the printed circuit board.

6. The electrical connector assembly as described in claim 5, wherein the printed circuit board includes conductive paths to link the program input end and the electrical elements for downloading the program, and cross-sections of said conductive paths are exposed upon a fracture surface where the program input end is cut.

7. The electrical connector assembly as described in claim 5, wherein the printed circuit board includes conductive paths to link the program input end and the electrical elements for downloading the program, and cross-sections of said conductive paths are located upon a fracture surface, where the program input end is cut, and further covered by insulative material for protection.

8. The electrical connector assembly as claimed in claim 5, wherein both said mating end and said program input end form conductive pads thereon for electrical transmission.

* * * * *